United States Patent [19]
Ha

[11] Patent Number: 6,104,247
[45] Date of Patent: Aug. 15, 2000

[54] POWER AMPLIFIER FOR MOBILE COMMUNICATION SYSTEM

[75] Inventor: Tae-Young Ha, Seoul, Rep. of Korea

[73] Assignee: Samsung Electronics Co., Ltd., Rep. of Korea

[21] Appl. No.: 09/316,987

[22] Filed: May 24, 1999

[30] Foreign Application Priority Data

May 23, 1998 [KR] Rep. of Korea ............ 98-18716

[51] Int. Cl.[7] .................. H03F 3/68; H03F 3/16; H03F 3/04; H01P 5/12
[52] U.S. Cl. .................. 330/295; 330/277; 330/302; 333/100
[58] Field of Search ................. 330/277, 295, 330/302; 333/100, 124

[56] References Cited

U.S. PATENT DOCUMENTS

| | | | |
|---|---|---|---|
| 5,274,341 | 12/1993 | Sekine et al. | 330/277 |
| 5,793,253 | 8/1998 | Kumar et al. | 330/295 |
| 5,955,926 | 9/1999 | Uda et al. | 330/295 |

*Primary Examiner*—Benny Lee
*Assistant Examiner*—Patricia T. Nguyen
*Attorney, Agent, or Firm*—Dilworth & Barrese

[57] ABSTRACT

A power amplifier for a radio communication system is provided which includes a divider for equally dividing a received signal into two signals, an amplifier for separately amplifying the divided signals with a same gain, and a combiner for combining the separately amplified signals into one output signal. The divider includes a first FET for equally dividing a signal received at a gate thereof into a signal being output at a drain thereof and a signal being output at a source thereof, a first inductor for coupling the drain of the first FET to a ground, a second inductor for coupling the source of the first FET to the ground, a first capacitor for coupling the drain of the first FET to an input of the first amplifier, and a second capacitor for coupling the source of the first FET to an input of the second amplifier. The amplifier includes at least one first amplifier for amplifying a signal output from the first capacitor, and at least one second amplifier for amplifying a signal output from the second capacitor. The combiner includes a second FET for combining a signal received at a drain thereof from the first amplifier and a signal received at a source thereof from the second amplifier, and outputting the combined signal at a gate thereof, a third inductor for coupling the drain of the second FET to the ground, a fourth inductor for coupling a source of the second FET to the ground, a third capacitor for coupling the drain of the second FET to an output of the first amplifier, and a fourth capacitor for coupling the source of the second FET to an output of the second amplifier.

6 Claims, 3 Drawing Sheets

POWER AMPLIFIER FOR MOBILE COMMUNICATION SYSTEM

PRIORITY

This application claims priority to an application entitled "Power Amplifier For Mobile Communication System" filed in the Korean Industrial Property Office on May 23, 1998 and assigned Ser. No. 98-18716, the contents of which are hereby incorporated by reference.

BACKGROUND OF THE INVENTION

1. Field of the Invention

The present invention relates generally to mobile communication systems, and in particular, to a power amplifier for a mobile communication system. More particularly, the present invention relates to a power amplifier for a mobile communication system where the power amplifier has a power divider at an input end and a power combiner at an output end for improving linearity thereof.

2. Description of the Related Art

In a code division multiple access (CDMA) mobile communication system, a mobile station and a base station each have a power amplifier for amplifying a received low-power signal or a transmission signal to a desired power level. A typical power amplifier for a CDMA mobile station or base station includes multiple amplifiers arranged in a cascaded design configuration having several stages. The overall performance characteristic of such a cascaded design configuration for the multiple amplifiers therefore depends mainly on the amplifier providing a final output signal, i.e., the final amplifier. Therefore, even though the amplifiers in the leading stage have a good characteristic, if the final amplifier has a poor characteristic, the overall performance characteristic of the power amplifier is adversely affected.

Accordingly, the final amplifier is designed to increase linearity, i.e., to cause the final output signal of the power amplifier to be linearly proportional to an input signal of the power amplifier. To achieve such a result, there is generally an increase in the amount of current consumed by the final amplifier which inevitably causes an increase in power consumption of the mobile station. The increase in power consumption leads to a decrease in a run-time (or life time) of a battery for the mobile station. Accordingly, the base station in radio communication with the mobile station also experiences an increases in power consumption. Therefore, there is a demand for a power amplifier which reduces the current consumption while maintaining linearity, even if the cascaded design configuration of multiple amplifiers is not used.

SUMMARY OF THE INVENTION

It is, therefore, an object of the present invention to provide a power amplifier for dividing a received signal, separately amplifying the divided signals, and thereafter combining the separately amplified signals.

It is another object of the present invention to provide a power amplifier having a power divider and a power combiner each including a field effect transistor having characteristics identical to a passive element.

To achieve the above objects, a power amplifier for a radio communication system includes a divider for equally dividing a received signal into two signals, an amplifier for separately amplifying the divided signals with a same gain, and a combiner for combining the separately amplified signals into one output signal.

The divider includes a first FET for equally dividing a signal received at a gate thereof into a signal being output at a drain thereof and a signal being output at a source thereof, a first inductor for coupling the drain of the first FET to a ground, a second inductor for coupling the source of the first FET to the ground, a first capacitor for coupling the drain of the first FET to an input of the first amplifier, and a second capacitor for coupling the source of the first FET to an input of the second amplifier.

The amplifier includes at least one -first amplifier for amplifying a signal output from the first capacitor, and at least one second amplifier for amplifying a signal output from the second capacitor.

The combiner includes a second FET for combining a signal received at a drain thereof from the first amplifier and a signal received at a source thereof from the second amplifier, and outputting the combined signal at a gate thereof, a third inductor for coupling the drain of the second FET to the ground, a fourth inductor for coupling a source of the second FET to the ground, a third capacitor for coupling the drain of the second FET to an output of the first amplifier, and a fourth capacitor for coupling the source of the second. FET to an output of the second amplifier.

DETAILED DESCRIPTION OF THE PREFERRED EMBODIMENTS

A preferred embodiment of the present invention will be described herein below with reference to the accompanying drawings. In the following description, well known functions or constructions are not described in detail since they would obscure the invention in unnecessary detail.

A power amplifier proposed by the present invention can reduce the current consumption while maintaining the linearity, even without using the cascade structure of multiple amplifiers. The proposed power amplifier is illustrated in FIG. 1.

Figure 1:
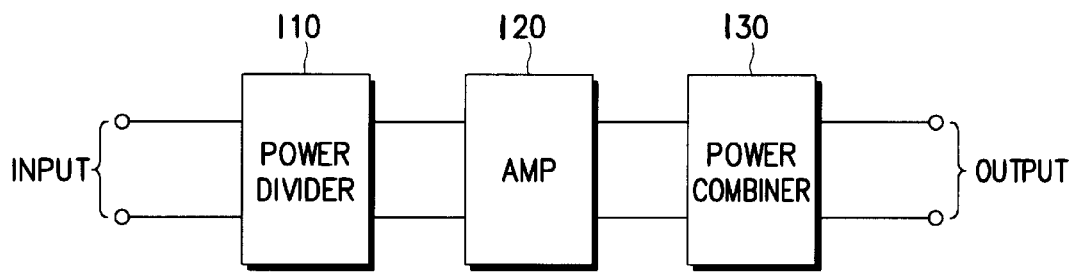
FIG. 1 is a block diagram illustrating a power amplifier according an embodiment of the present invention.

Referring to FIG. 1, the power amplifier includes a power divider 110 located at an input end and a power combiner 130 located at an output end. The power divider 110 and the power combiner 130 are composed of passive elements, such as transmission lines, to increase linearity.

That is, the power divider 110 equally divides a signal received at an input terminal, and the equally divided signals are amplified by an amplifier 120. The amplified signals are then combined into one output signal by the power combiner 130.

When the power divider 110 and the power combiner 130 are manufactured with transmission lines designed to carry signals having a frequency band of, for example, 1–2 GHz, the power amplifier increases in size.

Figure 2:
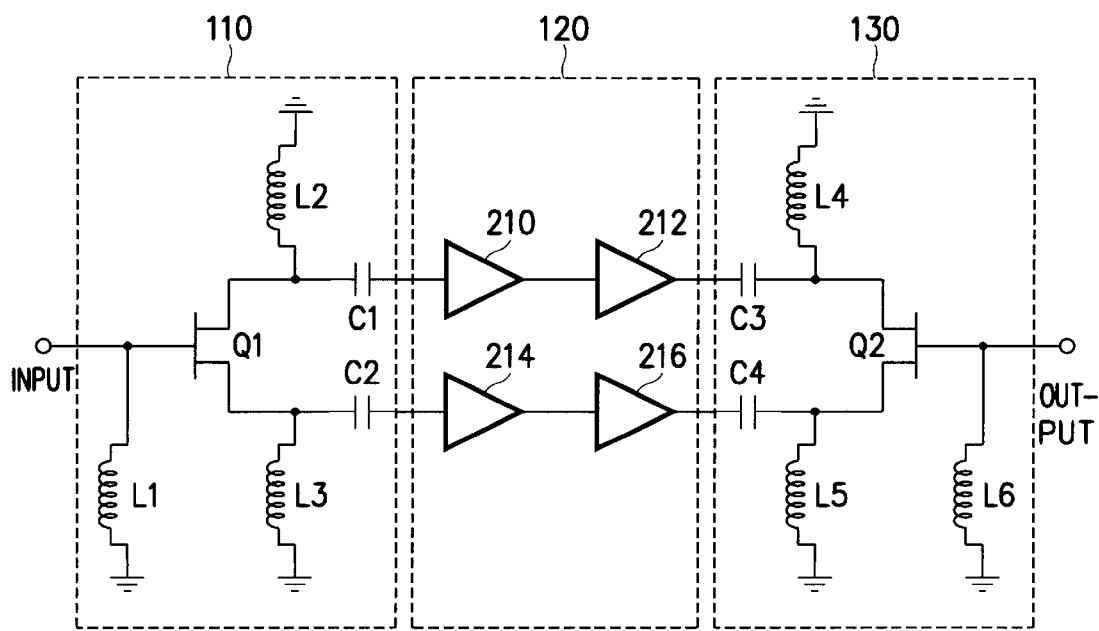
FIG. 2 is a schematic diagram illustrating the power amplifier of FIG. 1.

With reference to FIG. 2, there is illustrated a power amplifier according to the present invention. In FIG. 2, a field effect transistor (FET) Q1 in a power divider 110 equally divides an input signal received at an input node. Amplifiers 210–216 in an amplifying part 120 amplify the signals divided by FET Q1. An FET Q2 in a power combiner 130 combines the signals output from the amplifiers 210–216. Inductors L1, L2 and L3 and capacitors C1 and C2 in the power divider 110 serve for impedance matching and correcting of FET Q1. Similarly, inductors L4, L5 and L6 and capacitors C3 and C4 in the power combiner 130,serve for impedance matching and correcting of FET Q2.

Figure 3:
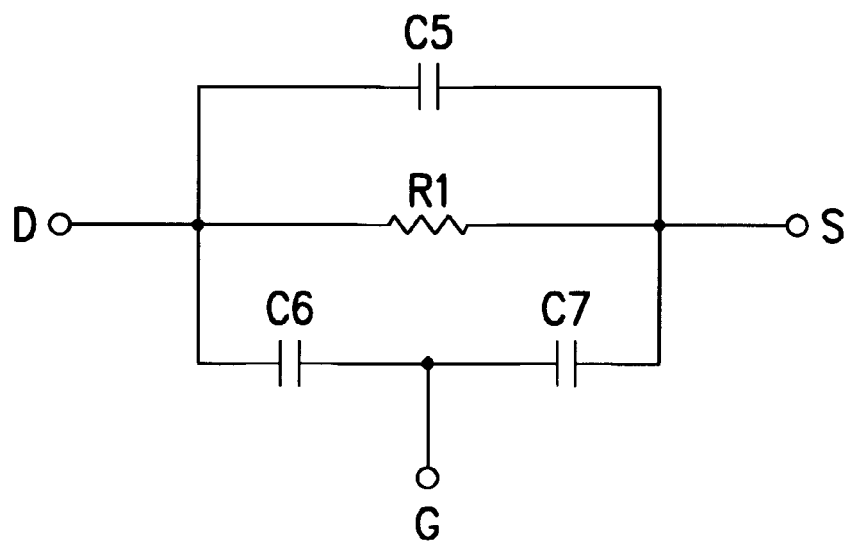
FIG. 3 is a diagram illustrating a field effect transistor of FIG. 2.

More specifically, FET Q1 has a gate grounded via the inductor L1, a drain grounded via the inductor L2 and a source grounded via the inductor L3. Also, the gate is coupled to the input node, the drain is coupled to the amplifier 210 via the capacitor C1 and the source is coupled to the amplifier 214 via the capacitor C2. An output of the amplifier 210 is coupled to an input of the amplifier 212; an output of which is coupled to a drain of FET Q2 via the capacitor C3. Similarly, an output of the amplifier 214 is coupled to an input of the amplifier 216; an output of which is coupled to a source of FET Q2 via the capacitor C4. The drain and source of FET Q2 are grounded via the inductors L4 and L5, respectively. A gate; connected to an output node, of FET Q2 is grounded via the inductor L6. The power divider 110 and the power combiner 130 can be composed of FETs Q1 and Q2 because FETs Q1 and Q2 have an equivalent design configuration as shown by FIG. 3.

A description will now be made regarding the operation of the power divider 110 and the power combiner 130 according to the present invention. FETs Q1 and Q2 both have an equivalent design configuration, as noted above and as shown by FIG. 3. Referring to FIG. 3, a capacitor C5 is coupled between a drain D and a source S. A capacitor C6 is coupled between the drain D and a gate G. A capacitor C7, having the same capacitance as that of the capacitor C6, is coupled between the source S and the gate G. Further, an internal resistor RI is coupled between the drain D and the source S.

FETs Q1 and Q2 having the equivalent design configuration serve as passive elements of the power amplifier when the gates are respectively grounded via inductors L1 and L6; the drains are respectively grounded via the inductors L2 and L4; and the sources are respectively grounded via the inductors L3 and L5. The internal resistors R1 in FETs Q1 and Q2 have a very high resistance. In addition, the capacitors C6 and C7 have the same capacitance, so that the drains and the sources of FETs Q1 and Q2 have the same structure when viewed into the gates of FETs Q1 and Q2.

Since the drain and the source of FET Q1 have the same structure, a signal input to the g at e of FET Q1 is equally distributed to the drain and source of FET Q1. The inductors L1, L2 and L3, and the capacitors C1 and C2 are used to match an input impedance of FET Q1 to an output impedance thereof.

Moreover, the divided signal output from the drain of FET Q1 is amplified by the amplifiers 210 and 212, and the divided signal output from the source of FET Q1 is amplified by the amplifiers 214 and 216. The amplified signals are provided to the drain and the source of FET Q2 in the power combiner 130. The signals input to the drain and the source of FET Q2 are combined at the gate. The inductors L4, L5 and L6, and the capacitors C3 and C4 are used-to match the input impedance of FET Q2 to the output impedance thereof.

The elements C1, C2, L1, L2 and L3 for correcting the output signal divided by FET Q1 and the elements C3, C4, L4, L5 and L6 for correcting the signal combined by FET Q2 have a common phase shifter structure (see I. D. Robertson, "MMIC Design", chapter 7, Phase Shifter). Here, the capacitors C1, C2, C3 and C4 serve to cut off a DC voltage input.

As described above, in the power amplifier according to the present invention, the power divider and the power combiner are implemented using field effect transistors having an equivalent design configuration, thereby contributing to an improved linearity of the overall power amplifier. In addition, the field effect transistors used for the power divider and the power combiner consume relatively less current, thereby having no adverse influence over the overall power consumption of the system. It is contemplated, that implementing the power amplifier of the present invention with an MMIC (Monolithic Microwave Integrated Circuit) may contribute to miniaturization, lightness and mass-production of the power amplifier, and in turn the mobile station, and the base station.

While the invention has been shown and described with reference to a certain preferred embodiment thereof, it will be understood by those skilled in the art that various changes in from and details may be made therein without departing from the spirit and scope of the invention as defined by the appended claims.

What is claimed is:

1. A power amplifier for a radio communication system, comprising:

a first field effect transistor for equally dividing a signal received at a gate thereof into a signal being output at a drain thereof and a signal being output at a source thereof;

a first amplifier for amplifying the signal output from the drain of the first FET;

a second amplifier for amplifying the signal output from the source of the first FET; and a second FET for combining a signal received at a drain thereof from the first amplifier and a signal received at a source thereof from the second amplifier, and outputting the combined signal at a gate thereof.

2. The power amplifier according to claim 1, further comprising:

a first inductor for coupling the drain of the first FET to a ground;

a second inductor for coupling the source of the first FET to the ground;

a first capacitor for coupling the drain of the first FET to an input of the first amplifier; and a second capacitor for coupling the source of the first FET to an input of the second amplifier.

3. The power amplifier according to claim 2, further comprising:

a third inductor for coupling the drain of the second FET to the ground;

a fourth inductor for coupling the source of the second FET to the ground;

a third capacitor for coupling the drain of the second FET to an output of the first amplifier; and a fourth capacitor for coupling the source of the second FET to an output of the second amplifier.

4. A power amplifier for a radio communication system, comprising:

a divider for equally dividing a received signal into two signals, said divider comprising:

a first FET for equally dividing a signal received at a gate thereof into a signal being output at a drain thereof and a signal being output at a source thereof, first inductor for coupling the drain of the first FET to a ground, a second inductor for coupling the source of the first FET to the ground, a first capacitor for coupling the drain of the first FET to an input of the first amplifier, and a second capacitor for coupling the drain of the first FET to an input of the second amplifier;

an amplifier for separately amplifying the divided signals with a same gain; and a combiner for combining the separately amplified signals into one output signal.

5. The power amplifier according to claim 4, wherein the amplifier comprises:

at least one first amplifier for amplifying a signal output from the first capacitor; and at least one second amplifier for amplifying a signal output from the second capacitor.

6. The power amplifier according to claim 5, wherein the combiner comprises:

a second FET for combining a signal received at a drain thereof from the first amplifier and a signal received at a source thereof from the second amplifier, and outputting the combined signal at a gate thereof;

a third inductor for coupling the drain of the second FET to the ground;

a fourth inductor for coupling a source of the second FET to the ground;

a third capacitor for coupling the drain of the second FET to an output of the first amplifier; and a fourth capacitor for coupling the source of the second FET to an output of the second amplifier.

* * * * *